United States Patent
Song et al.

(10) Patent No.: US 9,406,663 B2
(45) Date of Patent: Aug. 2, 2016

(54) SEMICONDUCTOR DEVICES

(71) Applicant: Samsung Electronics Co., Ltd., Suwon-Si, Gyeonggi-Do (KR)

(72) Inventors: Hyun-Seung Song, Incheon (KR); Kyung-Eun Kim, Seoul (KR); Jae-Kyun Park, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/161,867

(22) Filed: Jan. 23, 2014

(65) Prior Publication Data
US 2014/0203377 A1 Jul. 24, 2014

(30) Foreign Application Priority Data
Jan. 23, 2013 (KR) .......................... 10-2013-0007222

(51) Int. Cl.
*H01L 27/02* (2006.01)
*H01L 27/11* (2006.01)
*H01L 27/118* (2006.01)

(52) U.S. Cl.
CPC ........ *H01L 27/0207* (2013.01); *H01L 27/1104* (2013.01); *H01L 2027/11812* (2013.01); *H01L 2027/11838* (2013.01)

(58) Field of Classification Search
CPC ............ H01L 27/0207; H01L 27/1104; H01L 2027/11838; H01L 2027/11812; H01L 23/528; H01L 27/0203; H01L 27/118; H01L 27/11803; H01L 27/1807; H01L 27/11859; H01L 27/118566; H01L 27/11812; H01L 24/94; H01L 2027/1181
USPC .................................................. 257/202, 213
See application file for complete search history.

(56) References Cited

U.S. PATENT DOCUMENTS

| 5,644,525 | A  | 7/1997 | Takashima et al. |
| 5,886,938 | A  | 3/1999 | Haukness |
| 6,747,320 | B2 | 6/2004 | Nakabayashi |
| 7,030,437 | B2 | 4/2006 | Yodogawa et al. |
| 7,196,395 | B2 | 3/2007 | Kumagai et al. |

(Continued)

FOREIGN PATENT DOCUMENTS

| JP | 3166710 B2 | 5/2001 |
| KR | 20070036214 A | 4/2007 |

(Continued)

OTHER PUBLICATIONS http://www.thesaurus.com/browse/facing, 2015.*

*Primary Examiner* — Yu Chen
*Assistant Examiner* — Nilufa Rahim
(74) *Attorney, Agent, or Firm* — Harness, Dickey & Pierce P.L.C.

(57) ABSTRACT

Semiconductor devices include a first gate pattern provided on the first active region, a second gate pattern over the first active region, a third gate pattern over the second active region, and a fourth gate pattern over the second active region. The second gate pattern is parallel to the first gate pattern in a first direction. The third gate pattern has an asymmetric shape to the first gate pattern with respect to the first direction, and the fourth gate pattern is parallel to the third gate pattern in the first direction, and has an asymmetric shape to the second gate pattern with respect to the first direction. MOS transistors having good properties may be provided in a narrow horizontal area. The MOS transistors may be used in highly stacked semiconductor devices.

17 Claims, 9 Drawing Sheets

(56) References Cited

U.S. PATENT DOCUMENTS

| | | |
|---|---|---|
| 7,605,409 B2 | 10/2009 | Ahn et al. |
| 7,869,239 B2 | 1/2011 | Min et al. |
| 2004/0026759 A1* | 2/2004 | Nakabayashi ............... 257/499 |
| 2008/0298111 A1* | 12/2008 | Ahn et al. ...................... 365/51 |

FOREIGN PATENT DOCUMENTS

| | | |
|---|---|---|
| KR | 20070076810 A | 7/2007 |
| KR | 0843911 | 6/2008 |
| KR | 20090060637 A | 6/2009 |

* cited by examiner

SEMICONDUCTOR DEVICES

CROSS-REFERENCE TO RELATED APPLICATION

This application claims priority the benefit of priority under 35 USC §119 to Korean Patent Application No. 10-2013-0007222 filed on Jan. 23, 2013 in the Korean Intellectual Property Office (KIPO), the entire disclosure of which is incorporated herein by reference.

BACKGROUND

1. Field

Example embodiments relate to semiconductor devices. More particularly, example embodiments relate to semiconductor devices including transistors and/or methods of manufacturing the same.

2. Description of the Related Art

The sense amplifier of a semiconductor memory device may include a pull up device using a PMOS transistor and a pull down device using an NMOS transistor, and may amplify and output the data voltage of a bit line and a bit line bar. Recently, as the cell size of a semiconductor memory device decreases, a horizontal area occupied by the sense amplifier may be largely decreased. However, the formation of a number of transistors in a narrow horizontal area may be disadvantageous.

SUMMARY

Example embodiments provide a semiconductor device including a plurality of transistors in a limited horizontal area.

According to an example embodiment, there is provided a semiconductor device including neighboring first and second active regions and a device isolation region between the first and second active regions; a first gate pattern over the first active region, a second gate pattern over the first active region, a third gate pattern over the second active region, and a fourth gate pattern over the second active region. The second gate pattern is parallel to the first gate pattern in a first direction. The third gate pattern has an asymmetric shape to the first gate pattern with respect to the first direction, and the fourth gate pattern is parallel to the third gate pattern in the first direction, and has an asymmetric shape to the second gate pattern with respect to the first direction.

In example embodiments, the second gate pattern may have an asymmetric shape to the first gate pattern with respect to a second direction, the second direction being substantially perpendicular to the first direction.

In example embodiments, the fourth gate pattern may have an asymmetric shape to the third gate pattern with respect to a second direction, the second direction being substantially perpendicular to the first direction.

In example embodiments, the first gate pattern may include a first line pattern portion, and first and second extruded pattern portions at both end portions of the first line pattern portion, respectively. The second gate pattern may include a second line pattern portion, and third and fourth extruded pattern portions at both end portions of the second line pattern portion, respectively. The third gate pattern may include a third line pattern portion, and fifth and sixth extruded pattern portions at both end portions of the third line pattern portion, respectively. The fourth gate pattern may include a fourth line pattern portion, and seventh and eighth extruded pattern portions at both end portions of the fourth line pattern portion, respectively.

In example embodiments, the first and third gate patterns may face each other in the second direction, and the first and second extruded pattern portions may face the fifth and sixth extruded pattern portions, respectively.

In example embodiments, at least one pair of the extruded patterns facing each other may have different widths than each other in the second direction.

In example embodiments, the first extruded pattern portion may be non-parallel to the fifth extruded pattern portion, and the second extruded pattern portion may be non-parallel to the sixth extruded pattern portion.

In example embodiments, the second and fourth gate patterns may face each other in the second direction, and the third and fourth extruded pattern portions may face the seventh and eighth extruded pattern portions, respectively.

In example embodiments, the third extruded pattern portion may be non-parallel to the seventh extruded pattern portion, and the fourth extruded pattern portion may be non-parallel to the eighth extruded pattern portion.

In example embodiments, at least one pair of the extruded patterns facing each other may have different widths in the second direction than each other.

In example embodiments, contact plugs may be on at least one extruded pattern among the first to eighth extruded patterns.

In example embodiments, adjacently disposed second, third, sixth and seventh extruded patterns may be provided with each of the contact plugs, and the contact plugs may be in a zigzag pattern.

In example embodiments, the semiconductor device may include connecting wiring lines making electrical connection with each of the first to fourth gate patterns may be further included.

In example embodiments, a length of a first gap between the first and second gate patterns in the first direction, and a length of a second gap between the third and fourth gate patterns in the first direction, may be different.

In example embodiments, a length of the first gap between the first and second gate patterns in the first direction, and a length of the second gap between the third and fourth gate patterns in the first direction may be the same. The first and third gate patterns, and the second and fourth gate patterns may not be disposed in parallel in the second direction, and end portions of the first and third gate patterns, and end portions of the second and fourth gate patterns, may be separated from each other.

According to another example embodiment, a semiconductor device includes a substrate having a plurality of active regions separated from each other by device isolation regions, and a pair of gate patterns in each of the active regions. The pair of gate patterns are parallel to each other in a first direction. A first gate pattern in a first active region has an asymmetric shape to a first gate pattern in a second active region with respect to the first direction. A second gate pattern in the first active region has an asymmetric shape to a second gate pattern in the second active region with respect to the first direction.

The first gate pattern and the second gate pattern in the first active region may have an asymmetric shape with respect to each other in a second direction, the second direction being substantially perpendicular to the first direction, and the first gate pattern and the second gate pattern in the second active region may have an asymmetric shape with respect to each other in the second direction.

The semiconductor device may further include a third gate pattern in the first active region of the substrate, the third gate pattern having a same shape as the first gate pattern in the second active region.

The first gate pattern in the first active region may be non-parallel to the first gate pattern in the second active region with respect to a second direction, the second direction being substantially perpendicular to the first direction. End portions of the first gate pattern in the first active region and end points of the first gate pattern in the second active region may be alternately arranged in a zigzag pattern.

The semiconductor device may further include a third gate pattern in the first active region of the substrate, the third gate pattern having a same shape as the first gate pattern in the first active region.

As described above, semiconductor devices according to example embodiments may include neighboring gate patterns having extruded portions of different shapes. Thus, the gate patterns formed in different active regions may have asymmetric shapes.

Thus, a sufficient distance between neighboring extruded portions may be maintained even though the separated distance between the gate patterns may be decreased. Accordingly, the gate patterns may be easily formed by a photolithography process, and bridge defects of the extruded portions may be decreased. In addition, transistors may be formed in a narrow horizontal area, and a high integrated semiconductor device may be accomplished.

BRIEF DESCRIPTION OF THE DRAWINGS

Example embodiments will be more clearly understood from the following detailed description taken in conjunction with the accompanying drawings.

FIG. 1 is a circuit diagram of a unit sense amplifier of a semiconductor memory device according to an example embodiment;

FIG. 2 is a layout embodying a portion of a gate pattern included in a sense amplifier on a substrate in accordance with an example embodiment;

FIG. 3 illustrates wirings formed on the gate patterns in FIG. 2;

FIG. 4 is a layout of a portion of gate patterns included in a sense amplifier on a substrate in accordance with another example embodiment;

FIG. 5 illustrates wirings formed on the gate patterns in FIG. 4;

FIG. 6 is a layout of a portion of gate patterns included in a sense amplifier on a substrate in accordance with still another example embodiment;

FIG. 7 illustrates wirings formed on the gate patterns in FIG. 6;

FIG. 8 is a layout of a portion of gate patterns included in a sense amplifier on a substrate in accordance with a further example embodiment; and FIG. 9 illustrates wirings formed on the gate patterns in FIG. 8.

DETAILED DESCRIPTION OF EXAMPLE EMBODIMENTS

Figure 1:
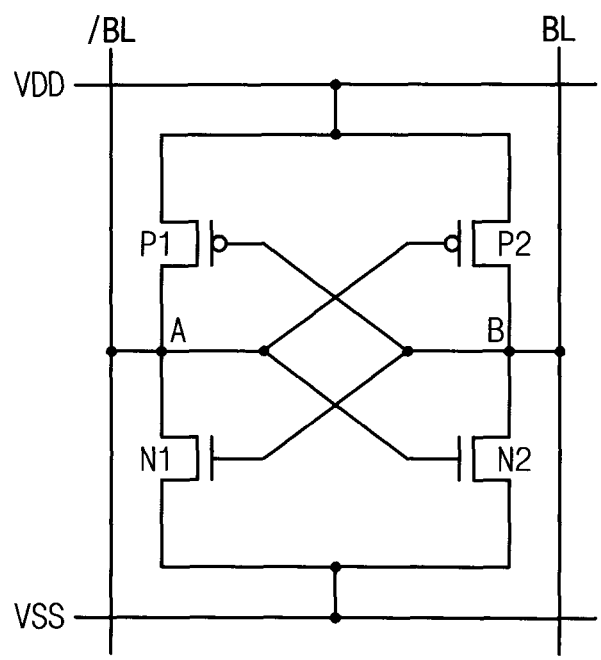
FIGS. 1 to 9 represent non-limiting, example embodiments as described herein.

Various example embodiments will now be described more fully with reference to the accompanying drawings in which some example embodiments are shown. However, specific structural and functional details disclosed herein are merely representative for purposes of describing example embodiments, and thus may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope of the disclosure.

In the drawings, the thicknesses of layers and regions may be exaggerated for clarity, and like numbers refer to like elements throughout the description of the figures.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that, if an element is referred to as being various elements, these elements should not be limited by these terms. These terms are only element or intervening elements may be present. In contrast, if an element is referred to as being "it will be understood that, if an element is referred to as being various elements, these elements should not be limited by these terms. These terms between elements should be interpreted in a like fashion (e.g., in contrast "directly between," "adjacent" versus "directly adjacent," etc.).

The terminology used herein is for the purpose of describing particular embodiments only and is not intended to be limiting of example embodiments. As used herein, the singular forms in "an" and "the" are intended to include the plural forms as well, unless the context clearly indicates otherwise. It will be further understood that the terms "comprises," "comprising," "includes" and/or "including," if used herein, specify the presence of stated features, integers, steps, operations, elements and/or components, but do not preclude the presence or addition of one or more other features, integers, steps, operations, elements, components and/or groups thereof.

Spatially relative terms (e.g., or the purpose of describing particular embodiments only and is not intended to be limiting of example embodiments. As used herein, the singular forms "a," "an" and "the" are element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be described in detail with reference to the accompanying drawings.

First Embodiment

Example embodiments relate to a semiconductor device including a plurality of transistors repeatedly disposed with a certain gap. Examples of the semiconductor devices having the structure may include a sense amplifier. Thus, example embodiments may be explained referring to the sense amplifier hereinafter.

FIG. 1 is a circuit diagram of a unit sense amplifier of a semiconductor memory device according to an example embodiment.

Referring to FIG. 1, the unit sense amplifier of a semiconductor memory device may include two NMOS transistors N1 and N2, and two PMOS transistors P1 and P2, and may amplify data voltage. That is, the unit sense amplifier may include first and second NMOS transistors N1 and N2, and first and second PMOS transistors P1 and P2. The first PMOS transistor P1 and the first NMOS transistor N1 may be connected in series between power supply voltage and ground connection. In addition, the second PMOS transistor P2 and the second NMOS transistor N2 may also be connected in series between the power supply voltage and the ground connection.

Each of the drains of the first PMOS transistor P1 and the first NMOS transistor N1 may make an electrical connection and may be provided as a common first drain A, and the common first drain A may be connected to a bit line bar /BL. In addition, each of the gates of the first PMOS transistor P1 and the first NMOS transistor N1 may make an electrical connection and may be provided as a common first gate, and the common first gate may be connected to a bit line BL.

Each of the drains of the second PMOS transistor P2 and the second NMOS transistor N2 may make an electric connection and may be provided as a common second drain B, and the common second drain B may be connected to the bit line BL. In addition, each of the gates of the second PMOS transistor P2 and the second NMOS transistor N2 may make an electric connection and may be provided as a common second gate, and the common second gate may be connected to the bit line bar /BL.

The unit sense amplifier may be respectively connected to one of the bit lines BL and one of the bit line bars /BL to amplify the voltage of the bit line BL or the bit line bar /BL. Through providing a plurality of the unit sense amplifiers, the sense amplifier in a semiconductor memory device may be formed.

Figure 2:
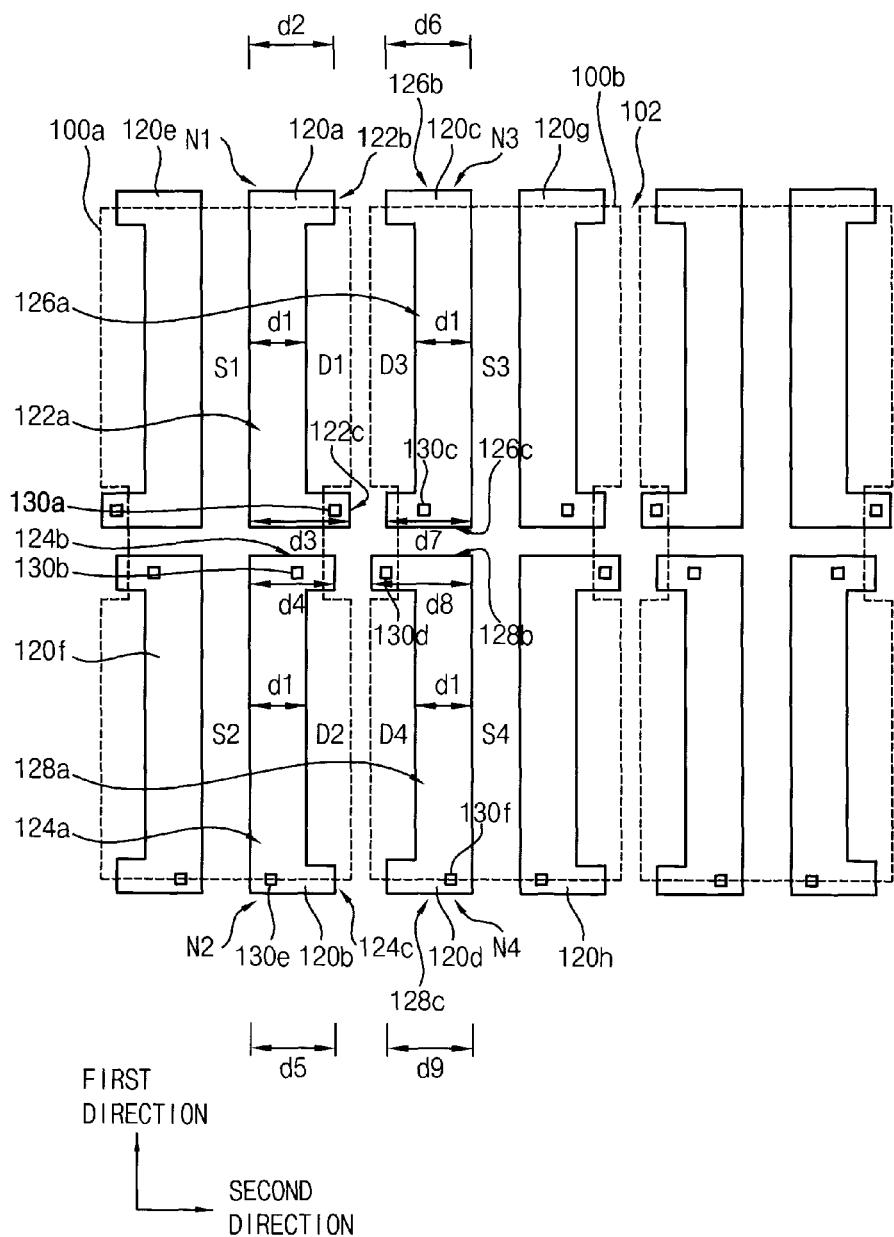
Figure 3:
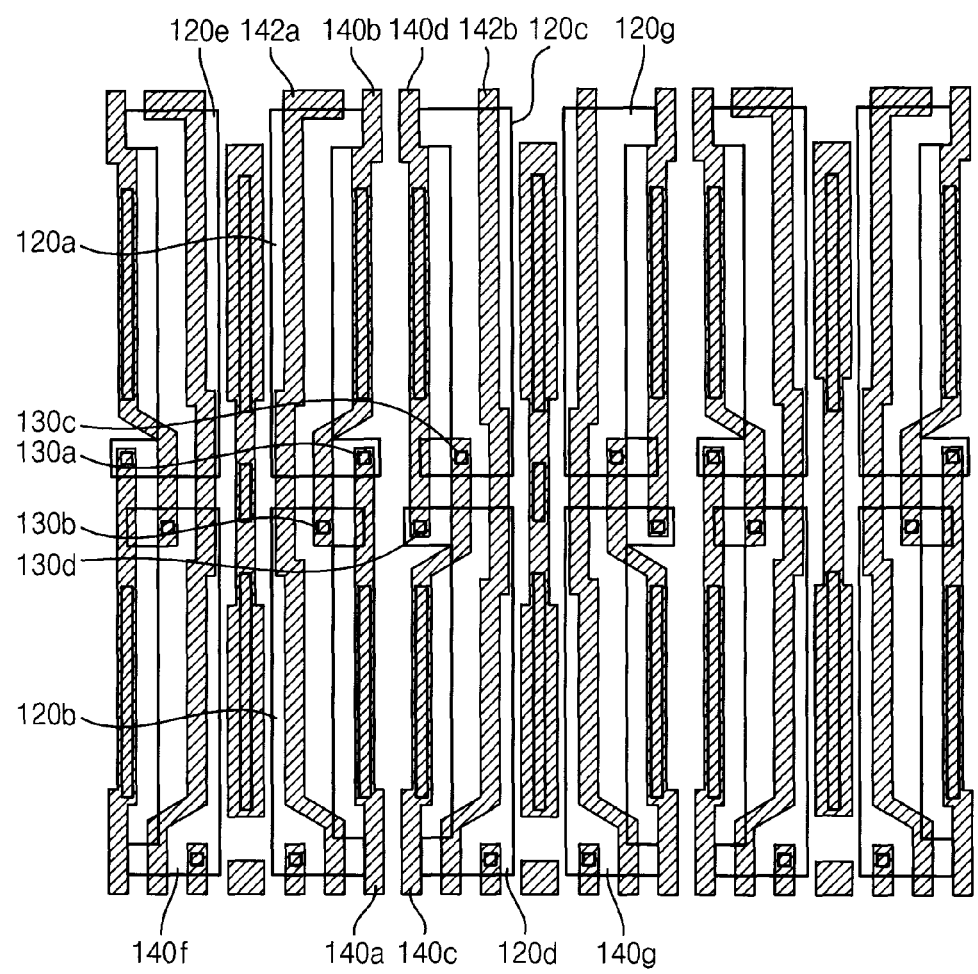
Figure 3:
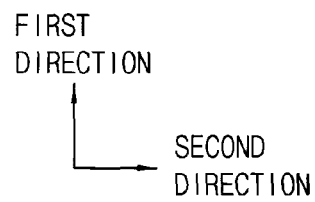

FIG. 2 is a layout of a portion of gate patterns included in a sense amplifier on a substrate in accordance with an example embodiment. FIG. 3 illustrates wirings formed on the gate patterns in FIG. 2.

As explained referring to FIG. 1, a unit sense amplifier may include two NMOS transistors N1 and N2, and two PMOS transistors P1 and P2. Thus, in order to embodying the sense amplifier, a first region for forming the NMOS transistor and a second region for forming the PMOS transistor may be included on the substrate. In addition, in order to electrically isolate each of the transistors, an active region and a device isolation region may be included in the substrate.

The NMOS transistor and the PMOS transistor formed on the first and second regions may include substantially the same shapes of the active regions and the gate patterns. Only the conductive types of impurities doped into the active regions and the gate patterns may be different due to different conductive types from each other.

Example embodiments relate to a layout of a semiconductor device in which a plurality of transistors may be repeatedly disposed with a certain distance. Thus, in order to explain the semiconductor layout in accordance with example embodiments, only the NMOS transistors formed in the first region of the substrate may be illustrated in FIG. 2.

Referring to FIG. 2, active regions 100a and 100b for forming the NMOS transistors may be provided in the substrate. The active regions 100a and 100b may have an isolated shape extending in a first direction. Each of the active regions 100a and 100b may be repeatedly disposed in a second direction. Hereinafter, the explanation will be given with the first and second active regions 100a and 100b repeatedly disposed in parallel in the second direction. The first and second active regions 100a and 100b may have the same shape and may have the same horizontal area. Between the first and second active regions 100a and 100b, each of device isolation regions 102 may be provided.

In an example embodiment, four NMOS transistors may be formed on each of the first and second active regions 100a and 100b. That is, NMOS transistors included in two unit sense amplifiers may be provided on each of the first and second active regions 100a and 100b.

First and second NMOS transistors N1 and N2 constituting one of a first unit sense amplifier may be provided on the first active region 100a.

The first NMOS transistor N1 may include a first gate pattern 120a and first and second impurity regions D1 and S1 in the substrate at both sides of the first gate pattern 120a. The second NMOS transistor N2 may include a second gate pattern 120b and third and fourth impurity regions D2 and S2 in the substrate at both sides of the second gate pattern 120b. The first and second gate patterns 120a and 120b may be disposed in parallel with a distance from each other in the first direction. The second and fourth impurity regions S1 and S2 may be connected to each other in the first active region 100a.

The first gate pattern 120a may include a first line pattern portion 122a extending the first direction, a first extruded pattern portion 122b provided at the first end portion of the first line pattern 122a, and a second extruded pattern portion 122c provided at the second end portion of the first line pattern 122a. The first and second extruded pattern portions 122b and 122c may have extruded shapes in the second direction which may be perpendicular to the first direction.

The first line pattern portion 122a may have a first width d1 in the second direction. The first extruded pattern portion 122b may have a second width d2 greater than the first width d1, and the second extruded pattern portion 122c may have a third width d3 greater than the first width d1. In this case, the second and third widths d2 and d3 may be the same or different.

The second gate pattern 120b may include a second line pattern portion 124a extending in the first direction, a third extruded pattern portion 124b provided at the first end portion of the second line pattern 124a, and a fourth extruded pattern portion 124c provided at the second end portion of the second line pattern 124a.

The third and fourth extruded pattern portions 124b and 124c may have extruded shapes in the second direction which may be perpendicular to the first direction. That is, the extruded direction of the third and fourth extruded pattern portions 124b and 124c may be the same as the extruded direction of the first and second extruded pattern portions 122b and 122c.

The second line pattern portion 124a may have a first width d1 in the second direction. That is, the first and second line pattern portions 122a and 124a may have the same width d1. In addition, the second line pattern portion 124a may be disposed in a row with the first line pattern portion 122a in the first direction.

In the first and second gate patterns 120a and 120b, the shapes of the extruded patterns facing to each other in the first direction may be different. That is, the third and fourth widths d3 and d4 of the second and third extruded pattern portions 122c and 124b may be different from each other. Thus, the first and second gate patterns 120a and 120b may have asymmetric shapes with the second direction as a reference.

The second extruded pattern portion 122c may have the third width d3 greater than the first width d1, and the third extruded pattern portion 124b may have the fourth width d4 greater than the first width d1. In this case, the third and fourth widths d3 and d4 may be different from each other. For example, as illustrated in the drawing, the third width d3 may be greater than the fourth width d4. Alternatively, the third width d3 may be smaller than the fourth width d4. Meanwhile, the fourth and fifth widths d4 and d5 may be the same or different.

As described above, the first and second gate patterns 120a and 120b of the two NMOS transistors N1 and N2 formed on the first active region 100a may not have the same shape.

Third and fourth transistors N3 and N4 constituting a second unit sense amplifier adjacent to the first unit sense amplifier may be provided. The third and fourth transistors N3 and N4 may be provided on the second active region 100b adjacent to the first active region 100a.

The third NMOS transistor N3 may include a third gate pattern 120c and fifth and sixth impurity regions D3 and S3 in the substrate at both sides of the third gate pattern 120c. The fourth NMOS transistor N4 may include fourth gate pattern 120d and seventh and eighth impurity regions D4 and S4 in the substrate at both sides of the fourth gate pattern 120d. The third and fourth gate patterns 120c and 120d may be disposed in parallel with a distance in the first direction. The sixth and eighth impurity regions S3 and S4 may be connected to each other in the second active region 100b.

The third gate pattern 120c may be disposed while facing the first gate pattern 120a in the second direction. The fourth gate pattern 120d may be disposed while facing the second gate pattern 120b in the second direction.

The third gate pattern 120c may include a third line pattern portion 126a extending in the first direction, a fifth extruded pattern portion 126b provided at the first end portion of the third line pattern 126a, and a sixth extruded pattern portion 126c provided at the second end portion of the third line pattern 126a. The fifth and sixth extruded pattern portions 126b and 126c may be disposed to face the first and second extruded pattern portions 122b and 122c with a distance, respectively. That is, the fifth and sixth extruded pattern portions 126b and 126c may be extruded to the counter directions of the first and second extruded pattern portions 122b and 122c from each other.

The third and first line pattern portions 126a and 122a may be disposed in parallel from each other. In addition, both end portions of the third and first line pattern portions 126a and 122a in the first direction may be positioned in parallel without dislocation from each other.

The third line pattern portion 126a may have the first width d1 in the second direction, the fifth extruded pattern portion 126b may have a sixth width d6 greater than the first width d1, and the sixth extruded pattern portion 126c may have a seventh width d7 greater than the first width d1. The sixth and seventh widths d6 and d7 may be the same or different.

In the first and third gate patterns 120a and 120c, at least one pair of extruded patterns facing from each other in the second direction may have different shapes. Thus, the first and third gate patterns 120a and 120c may have asymmetric shapes with the first direction as a reference. That is, the widths of the first and fifth extruded pattern portions 122b and 126b may be different from each other. Alternatively, the widths of the second and sixth extruded pattern portions 122c and 126c may be different from each other. As illustrated in the drawing, the second and sixth extruded pattern portions 122c and 126c may have different widths from each other. That is, the seventh width d7 may be smaller than the third width d3.

The fourth gate pattern 120d may include a fourth line pattern portion 128a extending in the first direction, a seventh extruded pattern portion 128b provided at the first end portion of the fourth line pattern 128a, and an eighth extruded pattern portion 128c provided at the second end portion of the fourth line pattern 128a. The seventh and eighth extruded pattern portions 128b and 128c may be disposed while facing the third and fourth extruded pattern portions 124b and 124c with a distance in the second direction, respectively. That is, the seventh and eighth extruded pattern portions 128b and 128c may be extruded to the counter directions of the third and fourth extruded pattern portions 124b and 124c from each other.

The fourth line pattern portion 128a may have a first width d1 in the second direction. The fourth line pattern portion 128a may be disposed in parallel in a row with the third line pattern portion 126a in the first direction. The seventh extruded pattern portion 128b may have an eighth width d8 greater than the first width d1, and the eighth extruded pattern portion 128c may have a ninth width d9 greater than the first width d1. The eighth and ninth widths d8 and d9 may be the same or different from each other.

In this case, at least a pair of the extruded pattern portions among the facing extruded pattern portions in the second direction may have different widths from each other. That is, the widths of the third and seventh extruded pattern portions 124b and 128b may be different from each other. Alternatively, the widths of the fourth and eighth extruded pattern portions 124c and 128d may be different from each other. Particularly, as illustrated in the drawing, the third and seventh extruded pattern portions 124b and 128b may have different widths from each other. The eighth width d8 may be greater than the fourth width d4.

A gap portion between the extruded patterns facing to each other in the second direction may be a device isolation region 102. That is, the gap portions between the first and fifth extruded patterns 122b and 126b, between the second and sixth extruded patterns 122c and 126c, between the third and seventh extruded patterns 124b and 128b, and between the fourth and eighth extruded patterns 124c and 128c, may be device isolation regions 102. At least a portion of the extruded patterns may be positioned on the device isolation region 102.

As described above, the third and fourth gate patterns 120c and 120d of the two NMOS transistors N3 and N4 formed on the second active region 100b may not have the same shape. That is, the third and fourth gate patterns 120c and 120d may have asymmetric shapes with the second direction as a reference.

The first to fourth line pattern portions 122a, 124a, 126a and 128a in the first to fourth gate patterns 120a to 120d may be provided as substantial gate electrodes. At least one of the first to eighth extruded pattern portions 122b, 122c, 124b, 124c, 126b, 126c, 128b and 128c in the first to fourth gate patterns 120a to 120d may be provided as a pad region for forming a connecting wiring with gate electrodes.

Each of the transistors may preferably have the same electric properties. Thus, the first to fourth line pattern portions 122a, 124a, 126a and 128a provided as the substantial gate electrodes may have the same first width. In addition, the first to fourth line pattern portions 122a, 124a, 126a and 128a may have the same length in the first direction.

The distance between the first and third line pattern portions 122a and 126a, and the distance between the second and fourth line pattern portions 124a and 128a may be the same. In addition, the distance between the first and second gate patterns 120a and 120b, and the distance between the third and fourth gate patterns 120c and 120d may be the same.

The distance between the extruded pattern portions facing to each other in the second direction may be determined to a distance possibly patterned through performing a photolithography process one time. For example, a first distance between the facing second and sixth extruded pattern portions 122c and 126c, and a second distance between the facing third and seventh extruded pattern portions 124b and 128b may be determined to a distance possibly patterned through performing the photolithography process one time. In this case, the second, third, sixth and seventh extruded pattern portions 122c, 124b, 126c and 128b may be disposed very closely. The gap portions between the extruded pattern portions disposed adjacently may not be positioned in parallel in the first direction.

As illustrated in the drawing, in the first active region 100a, the first and second gate patterns 120a and 120b, and fifth and sixth gate patterns 120e and 120f and may be provided. The fifth and sixth gate patterns 120e and 120f may have a symmetric shape to the first and second gate pattern with the first direction as a reference, respectively. In addition, in the second active region 100b, the third and fourth gate patterns 120c and 120d, and seventh and eighth gate patterns 120g and 120h may be provided. The seventh and eighth gate patterns 120g and 120h may have a symmetric shape to the first and second gate pattern with the first direction as a reference, respectively.

Hereinafter, each of the wirings formed in the transistors may be explained with reference to FIG. 3.

Referring to FIG. 3, on at least one extruded pattern portions included in the first to fourth gate patterns 120a to 120d, contact plugs 130a to 130f may be provided. As illustrated in the drawing, the first to fourth contact plugs 130a to 130d may contact on the second, third, sixth and seventh extruded pattern portions 122c, 124b, 126c and 128b, respectively. In addition, the fifth and sixth contact plugs 130e and 130f may contact on the fourth and eighth extruded pattern portions 124c and 128c. In addition, the contact plugs may be provided on each of the impurity regions S1 to S4 and D1 to D4, positioned at both side portions of the first to fourth gate patterns 120a to 120d.

In each of the unit sense amplifier, a first wiring 140a connecting the first gate pattern 102a of the first NMOS transistor N1 and the drain D2 of the second NMOS transistor N2 may be included. A second wiring 140b connecting the second gate pattern 102b of the second NMOS transistor N2 and the drain D1 of the first NMOS transistor N1 may be included. A third wiring 140c connecting the third gate pattern 102c of the third NMOS transistor N3 and the drain D4 of the fourth NMOS transistor N4 may be included. In addition, a fourth wiring 140d connecting the fourth gate pattern 102d of the fourth NMOS transistor N4 and the drain D3 of the third NMOS transistor N3 may be included.

Thus, the first to fourth wirings 140a to 140d may be connected on the first to fourth contact plugs 130a to 130d, respectively. In addition, additional wirings 142a and 142b extended while not making a contact with the first to fourth contact plugs 130a to 130d may be further provided adjacent to the first to fourth wirings 140a to 140d.

The first to fourth contact plugs 130a to 130d may be disposed in a zigzag shape in the second direction. Thus, the first to fourth wirings 140a to 140d may be formed on the first to fourth contact plugs 130a to 130d, respectively, with a sufficient distance. As illustrated in the drawing, the additional wiring lines 130e and 130f may be provided one per each at the outer sides of the first and fourth wirings 140a and 140d.

Each of the second, third, sixth and seventh extruded pattern portions 122c, 124b, 126c and 128b may have appropriate widths so that the first to fourth contact plugs 130a to 130d may be formed in a zigzag shape. Particularly, as illustrated in the drawing, the fourth width d4 may be smaller than the third width d3, and the eighth width d8 may be greater than the seventh width d7. In addition, the first distance between the second and sixth extruded pattern portions 122c and 126c, and the second distance between the third and seventh extruded pattern portions 124b and 128b may have sufficient widths so that the first and second distances may be formed by a photolithography process one time. For example, the third and sixth extruded pattern portions 124b and 126c having relatively small widths may have a width similar to the first width d1. In addition, the second extruded pattern portion 122c may be extruded to the side portion to the utmost limit while maintaining the first distance with the sixth extruded pattern portion 126c. The seventh extruded pattern portion 128b may be extruded to the side portion to the utmost limit while maintaining the second distance with the third extruded pattern portion 124b.

Thus, each of the extruded pattern portions may have a sufficient horizontal area for forming the first to fourth contact plugs 130a to 130d. In addition, the distance between the facing extruded pattern portions in the second direction may be increased.

Generally, when the first to fourth gate patterns respectively have symmetric shapes in the first and second directions, the area for forming the contact plugs on each of the extruded pattern portions may be decreased when the distance between the facing extruded pattern portions from each other in the second direction is increased. Thus, in order to increase the horizontal area of each of the extruded pattern portions, the distance between the extruded pattern portions may be largely decreased. Accordingly, the patterning for forming the first to fourth gate patterns may become difficult. That is, defects such as the short between each of the gate patterns may be easily generated.

In accordance with example embodiments, the first and second gate patterns 120a and 120b, and the third and fourth gate patterns 120c and 120d may have asymmetric shapes with the second direction as a reference. In addition, the first and third gate patterns 120a and 120c and the second and fourth gate patterns 120b and 120d may have asymmetric shapes with the first direction as a reference. Thus, the first distance between the facing second and sixth extruded pattern portions 122c and 126c in the second direction, and the second distance between the third and seventh extruded pattern portions 124b and 128b may be sufficiently increased. As described above, because the distance between each of the facing extruded pattern portions in the second direction is sufficiently large, the patterning and forming of the first to fourth gate patterns 120a to 120d may be easily performed. Thus, the first to fourth gate patterns 120a to 120d may be easily formed through performing a photolithography process one time. In addition, defects such as the short of the first to fourth gate patterns 120a to 120d may be decreased.

Meantime, the first and second contact plugs, and wiring structures having symmetric shapes to the first and second wirings with the first direction as a reference may be provided on the fifth and sixth gate patterns 120e and 120f. In addition, the third and fourth contact plugs, and wiring structures having symmetric shapes to the third and fourth wirings with the first direction as a reference may be provided on the seventh and eighth gate patterns 120g and 120h.

On the substrate, the NMOS transistor sets formed on the first and second active regions 100a and 100b may be repeatedly disposed in the second direction. The NMOS transistors may be provided as each of the NMOS transistors included in the sense amplifier.

Even though not illustrated, the PMOS transistors included in the sense amplifier may include the gate patterns having the same shapes as the NMOS transistors. That is, the PMOS transistors may be formed on active regions having the same shapes as the first and second active regions, and may include the same gate patterns as the first to eighth gate patterns.

Second Embodiment

Figure 4:
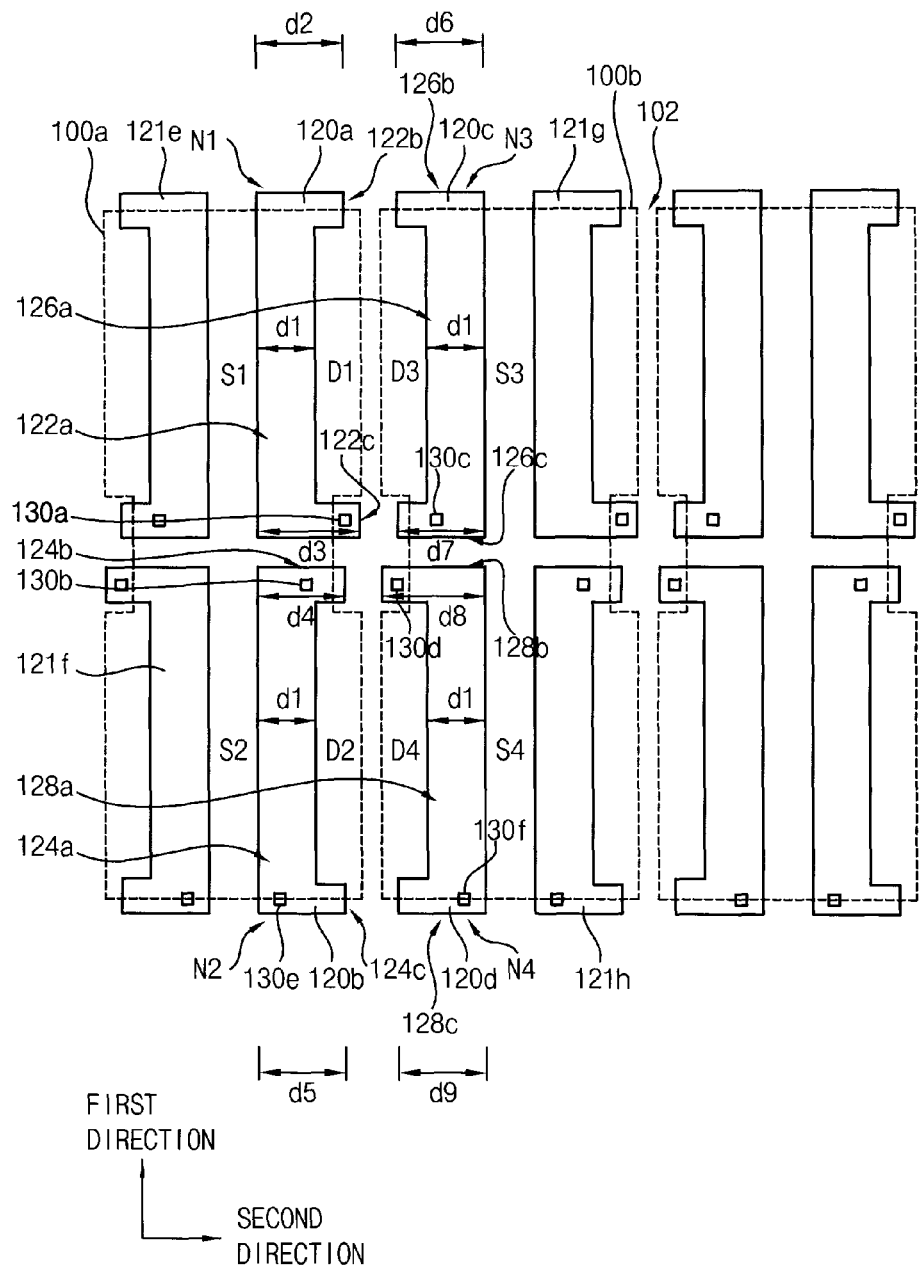
Figure 5:
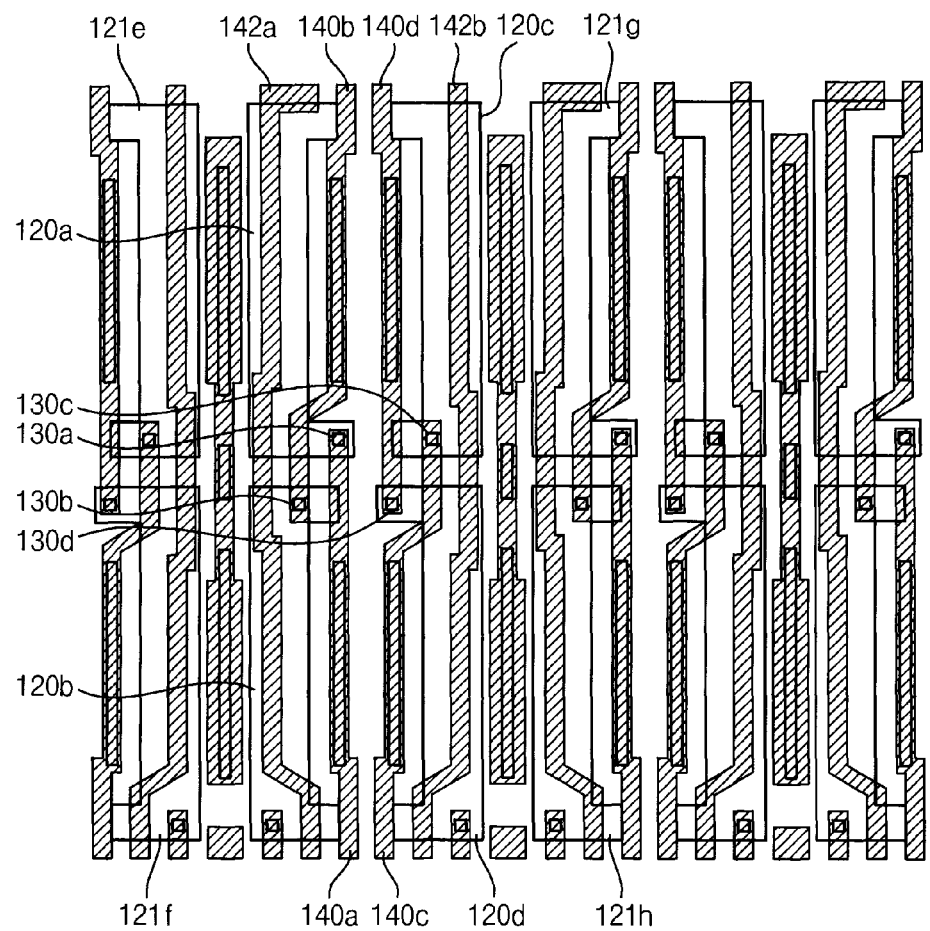

FIG. 4 is a layout of a portion of gate patterns included in a sense amplifier on a substrate in accordance with another example embodiment. FIG. 5 illustrates wirings formed on the gate patterns in FIG. 4.

In order to explain the layout in accordance with example embodiments, only the NMOS transistors formed in the first region of the substrate may be illustrated in FIG. 4.

Referring to FIG. 4, first and second active regions 100a and 100b for forming NMOS transistors may be provided in the substrate. Between the first and second active regions 100a and 100b, a device isolation region may be provided. The first and second active regions 100a and 100b may be the same as the explanation referring to FIG. 2.

On the first active region 100a, first and second gate patterns 120a and 120b may be provided. On the second active regions 100b, third and fourth gate patterns 120c and 120d may be provided. The first to fourth gate patterns 120a to 120d may be the same as those explained referring to FIG. 2.

On the first active region 100a, a fifth gate pattern 121e adjacent to the first gate pattern 120a in the second direction may be provided. The fifth gate pattern 121e may have the same shape as the third gate pattern 120c. That is, the first and fifth gate patterns 120a and 121e provided on the first active region 100a may not be symmetric with the first direction as a reference.

On the first active region 100a, a sixth gate pattern 121f adjacent to the second gate pattern 120b in the second direction may be provided. The sixth gate pattern 121f may have the same shape as the fourth gate pattern 120d. That is, the second and sixth gate patterns 120b and 121f provided on the first active region 100a may not be symmetric to each other with the first direction as a reference.

On the second active region 100b, a seventh gate pattern 121g adjacent to the third gate pattern 120c in the second direction may be provided. The seventh gate pattern 121g may have the same shape as the first gate pattern 120a. That is, the third and seventh gate patterns 120c and 121g provided on the second active region 100b may not be symmetric to each other with the first direction as a reference.

On the second active region 100b, an eighth gate pattern 121h adjacent to the fourth gate pattern 120d in the second direction may be provided. The eighth gate pattern 121h may have the same shape as the second gate pattern 120b. That is, the fourth and eighth gate patterns 120d and 121h provided on the second active region 100b may not be symmetric to each other with the first direction as a reference.

Hereinafter, each of the wirings formed in the transistors will be explained with reference to FIG. 4.

Referring to FIG. 4, first to fourth contact plugs 130a to 130d, and first to fourth wirings 140a to 140d may be provided on the first to fourth gate patterns 120a to 120d. In addition, first and second additional wirings 142a and 142b electrically disconnected with the first to fourth gate patterns 130a to 130d may be provided. The first to fourth contact plugs 130a to 130d, the first to fourth wirings 140a to 140d, and the first and second additional wirings 142a and 142b may be the same as those explained referring to FIG. 3.

The fifth and sixth gate patterns 121e and 121f may have the same shapes as the third and fourth gate patterns, respectively. Thus, the third and fourth contact plugs 130c and 130d, and wiring structures having the same shapes as the third and fourth wirings 140c and 140d may be provided on the fifth and sixth gate patterns 121e and 121f. In addition, the seventh and eighth gate patterns 120g and 120h may have the same shapes as the first and second gate patterns 120a and 120b, respectively. Thus, the first and second contact plugs and wiring structures having the same shapes as the first and second wirings may be provided on the fifth and sixth gate patterns 121e and 121f.

On the substrate, the NMOS transistor sets formed on the first and second active regions 100a and 100b may be repeatedly disposed in the second direction. The NMOS transistors may be provided as each of the NMOS transistors included in the sense amplifier.

Even though not illustrated, the PMOS transistors included in the sense amplifier may also include gate patterns having the same shapes as the NMOS transistors. That is, the PMOS transistors may be formed in active regions having the same shapes as the first and second active regions, and may include the same gate patterns as the first to eighth gate patterns.

Third Embodiment

Figure 6:
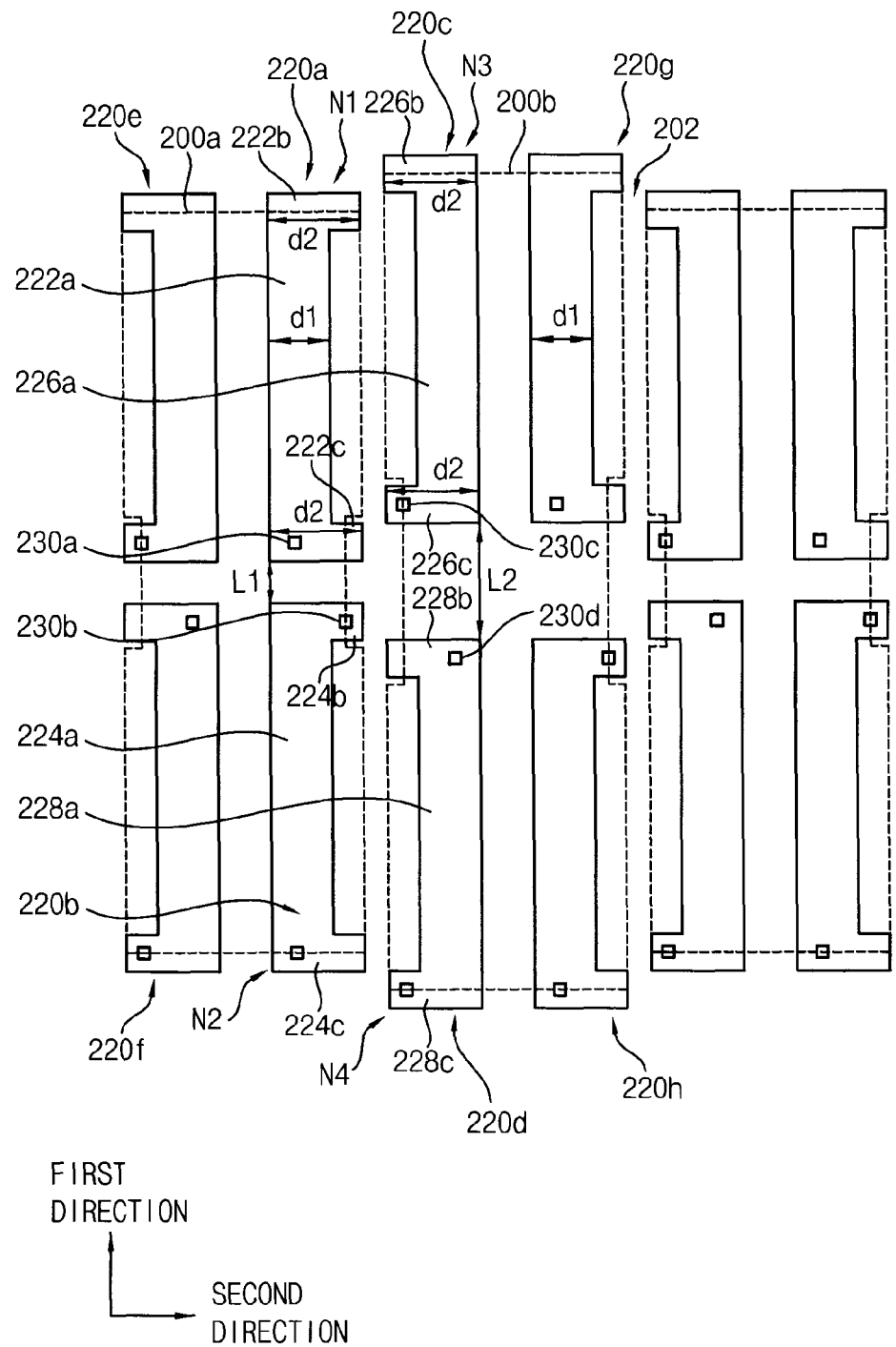
Figure 7:
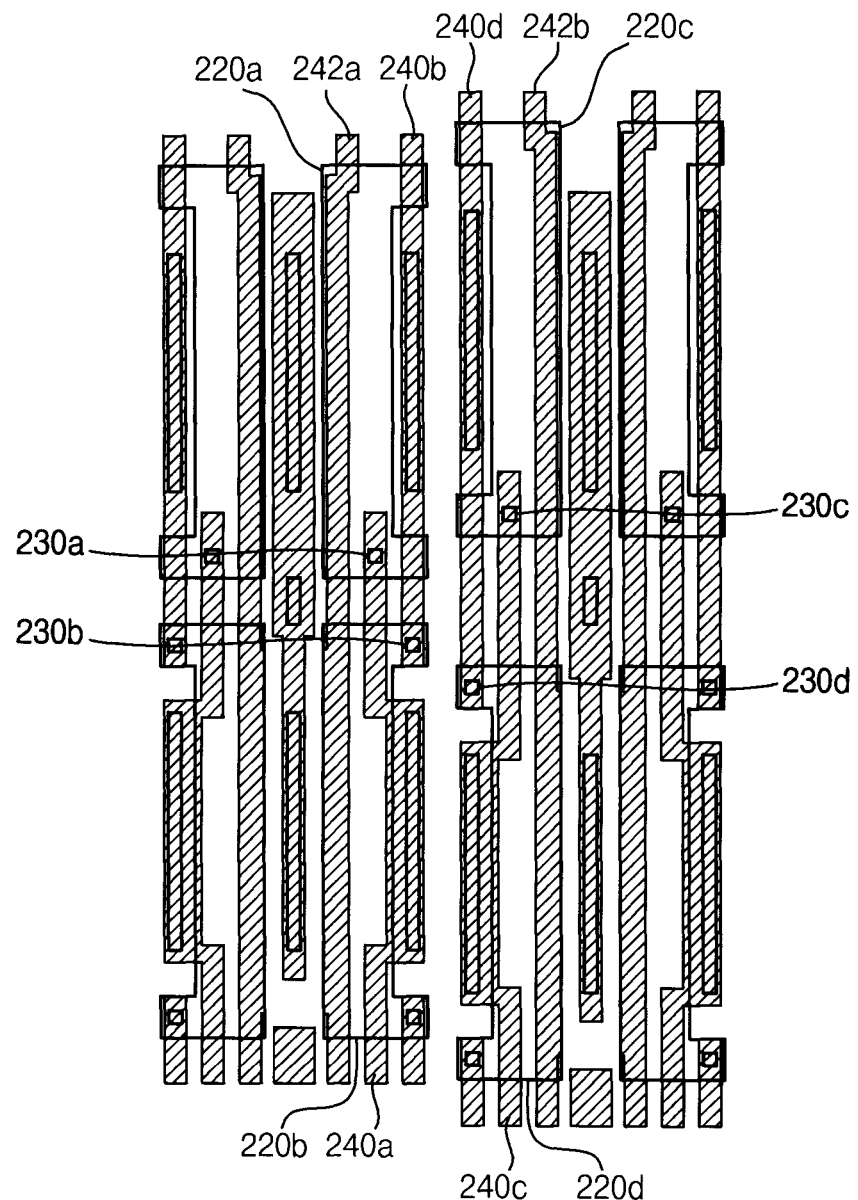
Figure 7:
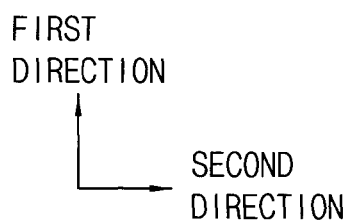

FIG. 6 is a layout of a portion of gate patterns included in a sense amplifier on a substrate in accordance with still another example embodiment. FIG. 7 illustrates wirings formed on the gate patterns in FIG. 6.

In order to explain the layout in accordance with example embodiments, only the NMOS transistors formed in the first region of the substrate may be illustrated in FIG. 6.

Referring to FIG. 6, first and second active regions 200a and 200b for forming NMOS transistors may be provided in the substrate. The first and second active regions 200a and 200b may have isolated shapes extended lengthily in the first direction. The first and second active regions 200a and 200b may have different shapes from each other. The first and second active regions 200a and 200b may be alternately and repeatedly disposed in the second direction. Between the first and second active regions 200a and 200b, a device isolation region may be provided.

The first active region 200a may have a first length in the first direction. The second active region 200b may have a second length greater than the first length in the first direction. The widths of the first and second active regions 200a and 200b in the second direction may be substantially the same. Thus, the first horizontal area of the first active region 200a may be smaller than the second horizontal area of the second active region 200b.

On each of the active regions 200a and 200b, four NMOS transistors may be formed. That is, on each of the active regions 200a and 200b, NMOS transistors included in two sense amplifiers may be embodied.

First and second NMOS transistors N1 and N2 constituting a first unit sense amplifier may be provided on the first active region 200a. Third and fourth NMOS transistors N3 and N4 constituting a second unit sense amplifier adjacent to the first unit sense amplifier may be provided. The third and fourth transistors N3 and N4 may be provided on the second active region 200b adjacent to the first active region 200a.

In the first to fourth transistors N1 to N4, each of the first to fourth gate patterns 220a to 220d may be included. Each of the first to fourth gate patterns 220a to 220d may include a line pattern and extruded pattern portions extruded to side portions at both end portions in the first direction. Hereinafter, the same designations on references used for explaining the first to fourth gate patterns in FIG. 2 may be used for the explanation on the first to fourth gate patterns 220a to 220d.

On the first active region 200a, the first and second gate patterns 220a and 220b may be disposed in parallel with a distance in the first direction. The first and second gate patterns may be separated by a first length L1. The first and second gate patterns 220a and 220b may have the same shape. In addition, the first and second gate patterns 220a and 220b may have symmetric shapes with the second direction as a reference.

The first gate pattern 220a may include a first line pattern portion 222a extending in the first direction, a first extruded pattern portion 222b provided at the first end portion of the first line pattern 222a, and a second extruded pattern portion 222c provided at the second end portion of the first line pattern 222a. The second gate pattern 220b may include a second line pattern portion 224a extending in the first direction, a third extruded pattern portion 224b provided at the first end portion of the second line pattern 224a, and a fourth extruded pattern portion 224c provided at the second end portion of the second line pattern 224a.

The first and second line pattern portions 222a and 224a may have the same first width d1 in the second direction. In addition, the first to fourth extruded pattern portions 222b, 222c, 224b and 224c may have a second width d2 greater than the first width d1. That is, the first to fourth extruded pattern portions 222b, 222c, 224b and 224c may have the same width.

On the second active region 200b, the third and fourth gate patterns 220c and 220d may be disposed in parallel with a distance in the first direction. The third and fourth gate patterns 220c and 220d may be separated by a second length L2 greater than the first length L1. The third and fourth gate patterns 220c and 220d may have substantially the same shape. In addition, the third and fourth gate patterns 220c and 220d may have symmetric shapes to each other with the second direction as a reference.

The third gate pattern 220c may include a third line pattern portion 226a extending in the first direction, a fifth extruded pattern portion 226b provided at the first end portion of the third line pattern 226a, and a sixth extruded pattern portion 226c provided at the second end portion of the third line pattern 226a. The fourth gate pattern 220d may include a fourth line pattern portion 228a extending in the first direction, a seventh extruded pattern portion 228b provided at the first end portion of the fourth line pattern 228a, and an eighth extruded pattern portion 228c provided at the second end portion of the fourth line pattern 228a.

The fifth to eighth extruded pattern portions 226b, 226c, 228b and 228c may be extruded in the counter direction of the extruded direction of the first to fourth extruded pattern portions 222b, 222c, 224b and 224c. The fifth to eighth extruded pattern portions 226b, 226c, 228b and 228c may have the same width, and may have the second width d2.

Each of the MOS transistors may preferably have the same electric properties. Thus, all of the first to fourth line pattern portions 222a, 224a, 226a and 228a provided as substantial gate electrodes may have the same first width d1. In addition, the first to fourth line pattern portions 222a, 224a, 226a and 228a may have the same length in the first direction.

The second, third, sixth and seventh extruded pattern portions 222c, 224b, 226c and 228b may be positioned adjacently from each other. However, the second and sixth extruded pattern portions 222c and 226c may not be disposed in parallel in the second direction. That is, the second and sixth extruded pattern portions 222c and 226c may be dislocated (or, alternatively, separated) without being overlapped in the second direction. In addition, the third and seventh extruded pattern portions 224b and 228b may not be disposed in parallel in the second direction. That is, the third and seventh extruded pattern portions 224b and 228b may be dislocated (or, alternatively, separated) without being overlapped in the second direction. Thus, the distance between the third and fourth gate patterns 220c and 220d, the second length L2, may be greater than the sum of the length of the second extruded pattern portion in the first direction, the length of the third extruded pattern portion in the first direction and the first length L1 in the first direction.

As described above, the first to fourth gate patterns 220a to 220d may not be disposed in parallel in the second direction but may be dislocated (or, alternatively, separated) to dispose the end portions thereof in a zigzag shape. Thus, the extruded pattern portions formed in the first active region 200a may not face the extruded pattern portions formed in adjacent second active region 200a. Thus, the extruded pattern portions formed in the first active region 200a may face the adjacent extruded pattern portions formed in other first active region 200a. Thus, the distance between the facing extruded pattern portions from each other may be largely increased. Accordingly, the first to fourth gate patterns 220a to 220d may be easily patterned, and defects such as the shorts of the first to fourth gate patterns 220a to 220d may not be generated.

As illustrated in the drawings, in the first active region 200a, the first and second gate patterns 220a and 220b, and symmetric fifth and sixth gate patterns 220e and 220f with the first direction as a reference may be provided. In addition, in the second active region 200b, the third and fourth gate patterns 220c and 220d, and symmetric seventh and eighth gate patterns 220g and 220h with the first direction as a reference may be provided.

At least one of the first to eighth extruded pattern portions 222b, 222c, 224b, 224c, 226b, 226c, 228b and 228c may be provided as a pad region for forming connecting wirings with gate electrodes.

Hereinafter, each of the wirings formed in the transistors may be explained with reference to FIG. 7.

Referring to FIG. 7, on the second, third, sixth and seventh extruded pattern portions 222c, 224b, 226c and 228b, each of the first to fourth contact plugs 230a to 230d may make a contact. On the first to fourth contact plugs 230a to 230d, each of the first to fourth wirings 240a to 240d may be connected.

As illustrated in the drawing, the first and second contact plugs 230a and 230b may not be disposed in parallel in the first direction. In addition, the third and fourth contact plugs 230c and 230d may not be disposed in parallel in the first direction. Thus, the first to fourth wirings may be formed with a distance from each other in the second direction.

In addition, additional wiring lines 242a and 242b extended adjacent to the first to fourth wirings 240a to 240d without making a contact with the contact plugs may be further provided. In addition, the contact plugs may also be provided on each of impurity regions positioned at both side portions of the first to fourth gate patterns 220a to 220d.

On the fifth and sixth gate patterns 220e and 220f, wirings having symmetric shapes to the first and second wirings with the first direction as a reference may also be provided. In addition, on the seventh and eighth gate patterns 220g and 220h, wirings having symmetric shapes to the third and fourth wirings with the first direction as a reference may be provided.

In the substrate, NMOS transistor sets formed on the first and second active regions 200a and 200b may be repeatedly disposed in the second direction. The NMOS transistors may be provided as each of the NMOS transistors included in the sense amplifier.

Even though not illustrated, the PMOS transistors included in the sense amplifier may also include gate patterns having the same shapes as the NMOS transistors. That is, the PMOS transistors may be formed in active regions having the same shapes as the first and second active regions, and may include the same gate patterns as the first to eighth gate patterns.

Fourth Embodiment

Figure 8:
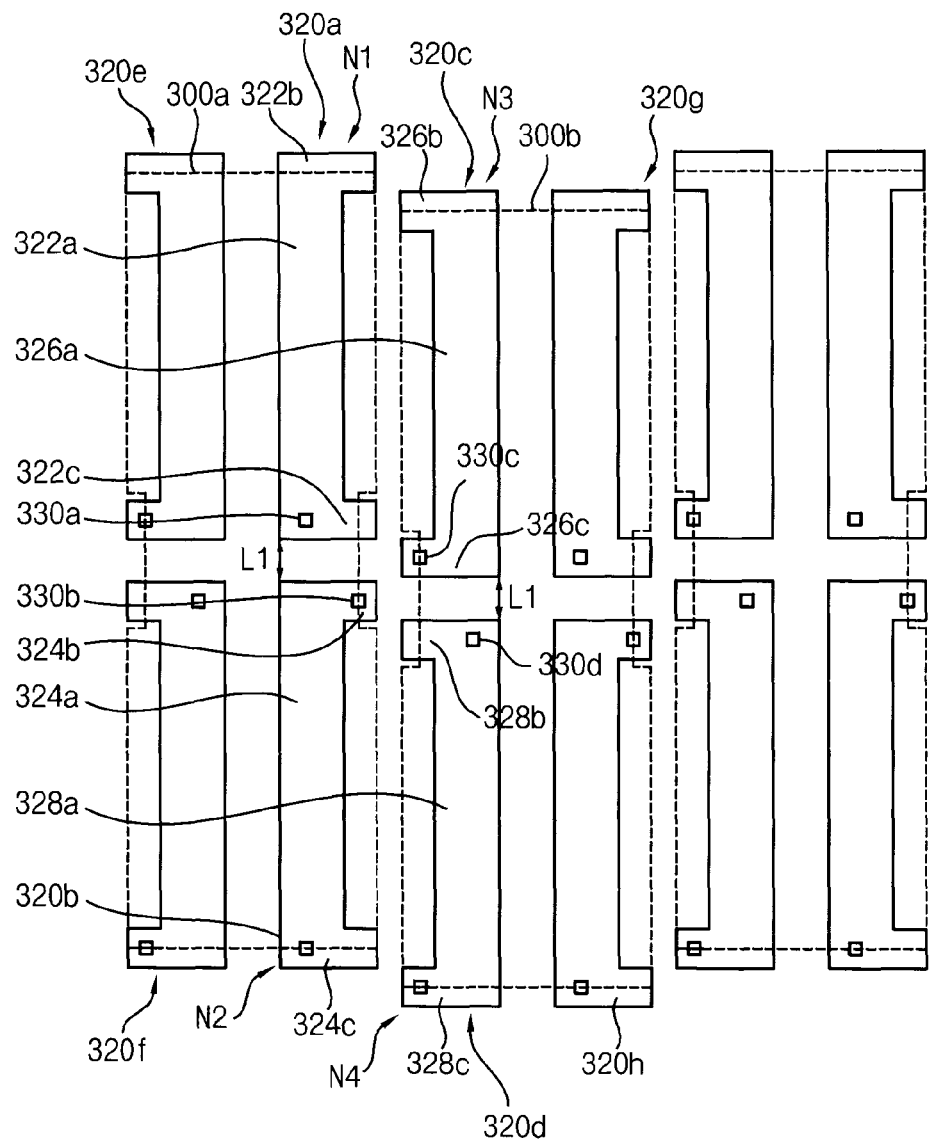
Figure 8:
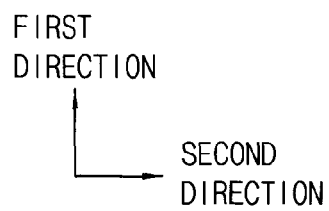
Figure 9:
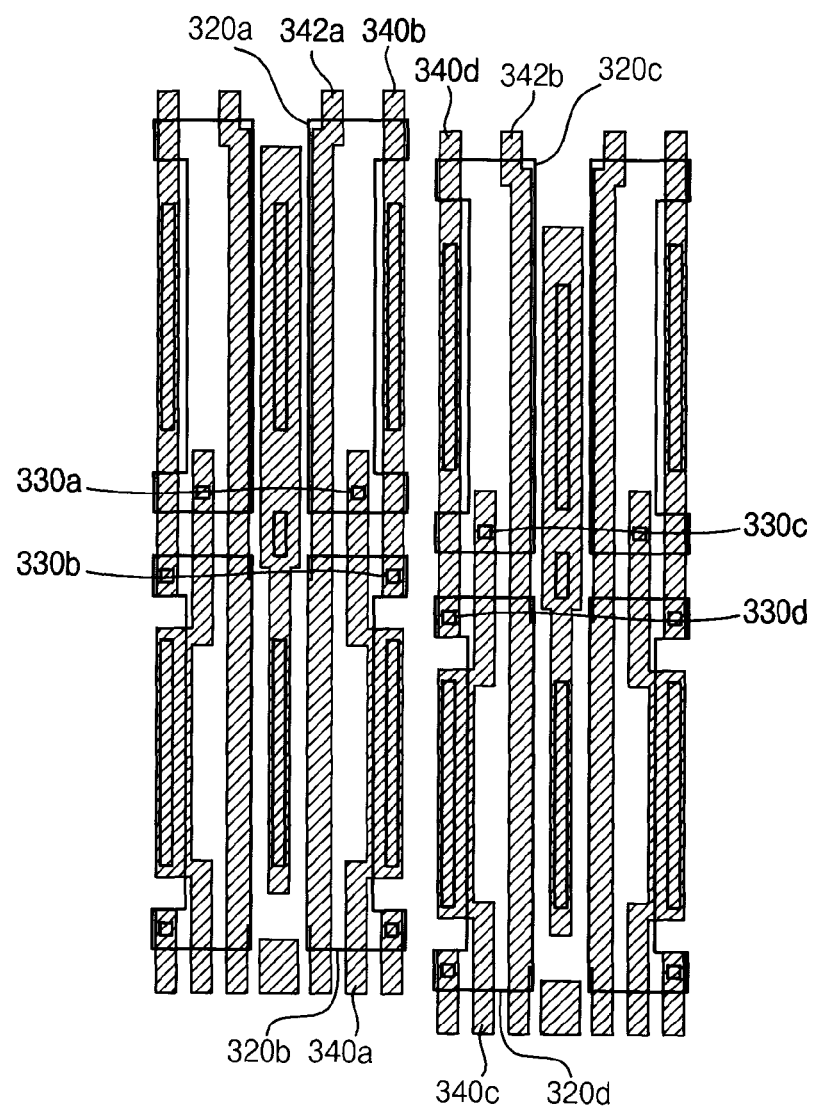

FIG. 8 is a layout of a portion of gate patterns included in a sense amplifier on a substrate in accordance with a further example embodiment. FIG. 9 illustrates wirings formed on the gate patterns in FIG. 8.

In order to explain the layout in accordance with example embodiments, only the NMOS transistors formed in the first region of the substrate may be illustrated in FIG. 8.

Referring to FIG. 8, first and second active regions 300a and 300b for forming the NMOS transistors may be provided in the substrate. The first and second active regions 300a and 300b may have isolated shapes extended lengthily in the first direction. The first and second active regions 300a and 300b may have the same shapes. Thus, the first and second active regions 300a and 300b may have substantially the same horizontal area. The first and second active regions 300a and 300b may be alternately and repeatedly disposed in the second direction. The first and second active regions 300a and 300b may not be disposed in parallel in the second direction, and the edge portions thereof may be dislocated (or, alternatively, separated) from each other.

On one of the isolated active regions 300a and 300b, four NMOS transistors may be formed. That is, on each of the active regions 300a and 300b, NMOS transistors included in two sense amplifiers may be embodied.

First and second NMOS transistors N1 and N2 constituting a first unit sense amplifier may be provided on a first active region 300a. Third and fourth NMOS transistors N3 and N4 constituting a second unit sense amplifier adjacent to the first unit sense amplifier may be provided. The third and fourth transistors N3 and N4 may be provided on a second active region 300b adjacent to the first active region 300a.

In the first to fourth transistors N1 to N4, each of first to fourth gate patterns 320a to 320d may be included. Each of the first to fourth gate patterns 320a to 320d may have the same shapes as each of the first to fourth gate patterns 220a to 220d explained referring to FIG. 4.

On the first active region 300a, the first and second gate patterns 320a and 320b may be disposed in parallel with a distance in the first direction. In addition, on the second active region 300b, the third and fourth gate patterns 320c and 320d may be disposed in parallel with a distance in the first direction. The first and second gate patterns 320a and 320b may be symmetric with the second direction as a reference. In addition, the third and fourth gate patterns 320c and 320d may be symmetric with the second direction as a reference.

In this case, the first and second gate patterns 320a and 320b may be separated by a first length L1 in the first direction. In addition, the third and fourth gate patterns 320c and 320d may be separated by the first length L1 in the first direction. Different from the explanation in the Third Embodiment, the length between the first and second gate patterns 320a and 320b, and the length between the third and fourth gate patterns 320c and 320d may be the same. In this case, the first length L1 may be the same as the length of the extruded pattern portion included in each of the gate patterns in the first direction, or may be greater.

The second and sixth extruded pattern portions 322c and 326c included in the first and third gate patterns 320a and 320c may not be disposed in parallel in the second direction. Particularly, the sixth extruded pattern portions 326c may be disposed to face the gap portion between the first and second gate patterns 320a and 320b.

In addition, the third and seventh extruded pattern portions 324b and 328b included in the second and fourth gate patterns 320b and 320d may not be disposed in parallel in the second direction. In example embodiments, the third extruded pattern portion 324b may be disposed to face the gap portion between the third and fourth gate patterns 320c and 320d. As described above, neighboring extruded pattern portions in the second direction in each of the gate patterns may not be disposed in parallel.

In accordance with example embodiments, the neighboring first and second active regions 300a and 300b may not be disposed in parallel in the second direction. The first and third gate patterns 320a and 320c formed on the first and second active regions 300a and 300b may not be disposed in parallel in the second direction. In addition, the second and fourth gate patterns 320b and 320d formed on the first and second active regions 300a and 300b may not be disposed in parallel in the second direction.

As described above, the first to fourth gate patterns 320a to 320d may not be disposed in parallel and may be dislocated (or, alternatively, separated), and thus, the end portions thereof may be disposed in a zigzag shape. Accordingly, the neighboring extruded pattern portions in the second direction may not face to each other. That is, the second extruded pattern portion 322c may face the third line pattern portion 326a of the third gate pattern 320c. The third extruded pattern portion 326c may face a neighboring extruded pattern portion (not illustrated) in the second active region. Thus, the separated distance between the extruded pattern portion and facing patterns may be very large. Accordingly, the first to fourth gate patterns 320a to 320d may be easily patterned, and defects such as the short between each of the gate patterns may not be generated.

As illustrated in the drawings, in the first active region 300a, fifth and sixth gate patterns 320e and 320f symmetric to the first and second gate patterns 320a and 320b with the first direction as a reference may be provided. In addition, in the second active region 300b, seventh and eighth gate patterns 320g and 320h symmetric to the third and fourth gate patterns 320c and 320d with the first direction as a reference may be provided.

At least one of the first to eighth extruded pattern portions 322b, 322c, 324b, 324c, 326b, 326c, 328b and 328c may be provided as a pad region for forming connecting wirings with the gate electrodes.

Hereinafter, each of the wirings formed in the transistors may be explained with reference to FIG. 9.

Referring to FIG. 9, the second, third, sixth and seventh extruded pattern portions 322c, 324b, 326c and 328b may be disposed very closely from each other. The first to fourth contact plugs 330a to 330d may contact on the second, third, sixth and seventh extruded pattern portions 322c, 324b, 326c and 328b, respectively. On the first to fourth contact plugs 330a to 330d, each of the first to fourth wirings 340a to 340d may be connected. In addition, additional wirings 342a and 342b extended adjacent to the first to fourth wirings 340a to 340d without making a contact with the contact plugs 330a to 330d may be further provided. In addition, contact plugs may be provided on each of impurity regions positioned at both sides of the first to fourth gate patterns 320a to 320d.

Wirings having shapes symmetric to the first and second wirings with the first direction as a reference may be provided on the fifth and sixth gate patterns 320e and 320f. In addition, wirings having shapes symmetric to the third and fourth wirings with the first direction as a reference may be provided on the seventh and eighth gate patterns 320g and 320h.

As illustrated in the drawing, the first and second contact plugs 330a and 330b may not be disposed in parallel in the first direction. In addition, the third and fourth contact plugs 330c and 330d may not be disposed in parallel in the first direction.

On the substrate, NMOS transistor sets formed on the first and second active regions 300a and 300b may be repeatedly disposed in the second direction. The NMOS transistors may be provided as each of the NMOS transistors included in the sense amplifier.

Even though not illustrated, the PMOS transistors included in the sense amplifier may also have the same shapes as the NMOS transistors. That is, the PMOS transistors may be formed in active regions having the same shapes as the first and second active regions, and may include the same gate patterns as the first to eighth gate patterns.

As described above, MOS transistors having good properties may be provided in a narrow horizontal area in accordance with example embodiments. The MOS transistors may be used in highly stacked semiconductor devices.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concepts. Accordingly, all such modifications are intended to be included within the scope of the present inventive concepts as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A semiconductor device, comprising:
   a substrate including neighboring first and second active regions and a device isolation region between the first and second active regions;
   a first gate pattern over the first active region, the first gate pattern including a first line pattern portion, and first and second extruded pattern portions at both end portions of the first line pattern portion, respectively;
   a second gate pattern over the first active region,
      the second gate pattern including a second line pattern portion, and third and fourth extruded pattern portions at both end portions of the second line pattern portion, respectively, and
      the second line pattern portion being aligned with the first line pattern portion in a first direction, and;
   a third gate pattern over the second active region,
      the third gate pattern having an asymmetric shape to the first gate pattern with respect to the first direction,
      the third gate pattern including a third line pattern portion, and fifth and sixth extruded pattern portions at both end portions of the third line pattern portion, respectively,
      the first extruded pattern portion facing the fifth extruded pattern portion, and the second extruded pattern portion facing the sixth extruded pattern portions, and
      contact plugs being mounted on each of a respective one of the first extruded pattern portion and the fifth extruded pattern portion; and
   a fourth gate pattern over the second active region,
      the fourth gate having an asymmetric shape to the second gate pattern with respect to the first direction,
      the fourth gate pattern including a fourth line pattern portion, and seventh and eighth extruded pattern portions at both end portions of the fourth line pattern portion, respectively,
      the fourth line pattern portion being aligned with the third line pattern portion in the first direction, and
   the second gate pattern having an asymmetric shape to the first gate pattern with respect to a second direction, the second direction being substantially perpendicular to the first direction.

2. The semiconductor device of claim 1, wherein the fourth gate pattern has an asymmetric shape to the third gate pattern with respect to the second direction.

3. The semiconductor device of claim 1, wherein the first and third gate patterns face each other in the second direction.

4. The semiconductor device of claim 3, wherein at least one pair of the extruded pattern portions facing each other has different widths than each other in the second direction.

5. The semiconductor device of claim 4, wherein
   the first extruded pattern portion is non-parallel to the fifth extruded pattern portion, and
   the second extruded pattern portion is non-parallel to the sixth extruded pattern portion.

6. The semiconductor device of claim 1, wherein
the second and fourth gate patterns are facing each other in the second direction, and
the third and fourth extruded pattern portions face the seventh and eighth extruded pattern portions, respectively.

7. The semiconductor device of claim 6, wherein
the third extruded pattern portion is non-parallel to the seventh extruded pattern portion, and
the fourth extruded pattern portion is non-parallel to the eighth extruded pattern portion.

8. The semiconductor device of claim 6, wherein at least one pair of the extruded pattern portions facing each other has different widths in the second direction than each other.

9. The semiconductor device of claim 1, wherein
adjacently disposed second, third, sixth and seventh extruded pattern portions are each provided with a contact plug, and
the contact plugs with the second, third, sixth and seventh extruded pattern portions are in a zigzag pattern.

10. The semiconductor device of claim 1, further comprising:
wiring lines electrically connected with each of the first to fourth gate patterns.

11. The semiconductor device of claim 1, wherein a length of a first gap between the first and second gate patterns in the first direction, and a length of a second gap between the third and fourth gate patterns in the first direction are different.

12. The semiconductor device of claim 1, wherein
a length of the first gap between the first and second gate patterns in the first direction, and a length of the second gap between the third and fourth gate patterns in the first direction are the same,
the first and third gate patterns, and the second and fourth gate patterns, are not disposed in parallel in the second direction, and
end portions of the first and third gate patterns, and end portions of the second and fourth gate patterns, are separated from each other.

13. A semiconductor device, comprising:
a substrate having a plurality of active regions separated from each other by device isolation regions; and
a pair of gate patterns in each of the active regions, the pair of gate patterns being parallel to each other in a first direction,
a first gate pattern in a first active region having an asymmetric shape to a first gate pattern in a second active region with respect to the first direction,
the first gate patterns in the first and second active regions each include a first line pattern portion, and first and second extruded pattern portions at both end portions of the first line pattern portion, respectively,
a second gate pattern in the first active region having an asymmetric shape to a second gate pattern in the second active region with respect to the first direction,
the second gate patterns in the first and second active regions each include a second line pattern portion, and third and fourth extruded pattern portions at both end portions of the second line pattern portion, respectively,
the first extruded pattern portion of the first gate pattern in the first active region facing the third extruded pattern portion of the second gate pattern in the second active region,
the first extruded pattern portion of the first gate pattern in the second active region facing the third extruded pattern portion of the second gate pattern in the first active region,
the second extruded pattern portion of the first gate pattern in the first active region facing the fourth extruded pattern portion of the second gate pattern in the second active region,
the second extruded pattern portion of the first gate pattern in the second active region facing the fourth extruded pattern portion of the second gate pattern in the first active region,
the first and second gate patterns in at least one of the first active region and second active region having an asymmetric shape with respect to each other in a second direction, the second direction being substantially perpendicular to the first direction,
a contact plug being mounted on the first extruded pattern portion and over the first active region,
the second line pattern portion in the first active region being aligned in the first direction to the first line pattern portion in the first active region, and
the second line pattern portion in the second active region being aligned in the first direction to the first line pattern portion in the second active region.

14. The semiconductor device of claim 13, wherein
the first gate pattern and the second gate pattern in the first active region have a first asymmetric shape with respect to each other in the second direction, and
the first gate pattern and the second gate pattern in the second active region have a second asymmetric shape with respect to each other in the second direction.

15. The semiconductor device of claim 13, further comprising:
a third gate pattern in the first active region of the substrate, the third gate pattern having a same shape as the first gate pattern in the second active region.

16. The semiconductor device of claim 13, wherein
the first gate pattern in the first active region is non-parallel to the first gate pattern in the second active region with respect to the second direction, and
end portions of the first gate pattern in the first active region and end points of the first gate pattern in the second active region are alternately arranged in a zigzag pattern.

17. The semiconductor device of claim 16, further comprising:
a third gate pattern in the first active region of the substrate, the third gate pattern having a same shape as the first gate pattern in the first active region.

* * * * *